(12) United States Patent
Miyazawa et al.

(10) Patent No.: US 6,510,074 B2
(45) Date of Patent: Jan. 21, 2003

(54) FERROELECTRIC MEMORY HAVING A BATIO₃ RECORDING LAYER ORIENTED IN A <111> DIRECTION

(75) Inventors: Hiromu Miyazawa, Suwa (JP); Takamitsu Higuchi, Suwa (JP); Setsuya Iwashita, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/103,681

(22) Filed: Mar. 21, 2002

(65) Prior Publication Data

US 2002/0154532 A1 Oct. 24, 2002

(30) Foreign Application Priority Data

| Mar. 21, 2001 | (JP) | 2001-081352 |
| Mar. 21, 2001 | (JP) | 2001-081353 |
| Mar. 21, 2001 | (JP) | 2001-081354 |
| Mar. 15, 2002 | (JP) | 2002-073091 |

(51) Int. Cl.⁷ .............................................. G11C 11/22
(52) U.S. Cl. ....................... 365/145; 365/173; 365/171; 257/295
(58) Field of Search ................................. 365/145, 173, 365/171; 257/295; 438/3

(56) References Cited

U.S. PATENT DOCUMENTS 6,258,459 B1 * 7/2001 Noguchi et al. ............ 428/446

* cited by examiner

Primary Examiner—Andrew Q. Tran
(74) Attorney, Agent, or Firm—Harness, Dickey & Pierce, P.L.C.

(57) ABSTRACT

A ferroelectric memory element and an electronic apparatus provided with this ferroelectric memory element are provided with a thin film recording layer of less than 50 nm film thickness having a high polarization moment and a high Curie temperature, wherein a recording layer of $BaTiO_3$ is fabricated so as to be oriented in a pseudo-cubic system <111> direction in a trigonal crystal structure, and in order to increase the polarization moment and Curie temperature, the unit cell in $BaTiO_3$ film is elongated more than 2% in the pseudo-cubic system <111> direction compared with the unit cell in a bulk material of $BaTiO_3$, wherein in order to produce lattice strain in the crystal structure of the recording layer, the recording layer is grown epitaxially on the electrode layer that serves as the base layer, the ferroelectric memory element being provided with the recording layer, and the electronic apparatus being provided with the ferroelectric memory element.

28 Claims, 9 Drawing Sheets

FERROELECTRIC MEMORY HAVING A BATIO₃ RECORDING LAYER ORIENTED IN A <111> DIRECTION

BACKGROUND OF THE INVENTION

1. Field of the Invention

The present invention relates to a ferroelectric memory element having a high polarization moment and a high Curie temperature, in particular to a ferroelectric memory element having a high polarization moment and a high Curie temperature when a ferroelectric recording layer is made into a thin film of less than 50 nm thickness, and relates to an electronic apparatus provided with this ferroelectric memory element.

2. Description of the Related Art

Currently, the use of ferroelectric materials comprising transition metal oxides, typically represented by $PbZr_{1-x}Ti_xO_3$ (PZT) and $SrBi_2Ta_2O_3$ (SBT), in the recording layer of a non-volatile memory element has allowed the realization of high memory capacity and low power consumption of such memory devices. A typical elemental structure is produced by laminating a ferroelectric material such as PZT or SBT on top of the lower electrode made of such materials as Pt, Ir, and the like and further laminating such materials as Pt or Ir as the upper electrode to form a capacitor device. It is desirable for such memory elements to have characteristics of high polarization moment and Curie temperature. As requirements of the sensor amplifier, the polarization moment should be at least 10 $\mu C/cm^2$. Also, from the viewpoint of reliability of recorded data, it is desirable that the Curie temperature be higher than 200° C. Further, it is necessary that a structural phase transition does not occur within the temperature range of usage (for example, −10 to 100° C.).

In recent years, on the other hand, further refinement in the size of the elemental structure is being made for the purpose of producing memories of gigabit capacity. To realize such an objective, ferroelectric materials must also be made available in thin films. For example, a film thickness of 150 nm has been sufficient when the design rule was 0.35 $\mu m$, but when the design rule becomes finer than 0.10 $\mu m$, a film thickness of 50 nm or even 20 nm is needed. It has, therefore, become necessary to provide a ferroelectric material that can provide high performance even in such thin film regions.

In thin film regions of less than 50 nm thickness, it is possible to epitaxially deposit a ferroelectric material on the lower electrode. According to a publication in the Japanese Journal of Applied Physics, Vol. 38, (1999), pp. 5305, it is reported that a higher polarization moment and Curie temperature than those in bulk crystals are obtained in the recording layer by growing a tetragonal crystal of $BaTiO_3$ oriented in a <001> direction. The film thickness in this case is 12 nm. The lower electrode comprises $SrRuO_3$ deposited on the (001) surface of a $SrTiO_3$ substrate. In this case, the length of the a-axis of tetragonal $BaTiO_3$ is compressed by the epitaxial growth so as to match the a-axial length 391 pm of $SrTiO_3$. In this case, to maintain the Poisson's ratio, the c-axial length of $BaTiO_3$ is elongated even up to 437 pm. The polarization moment of $BaTiO_3$ having the c-elongated crystal structure is about 35 $\mu C/cm^2$, and the Curie temperature is estimated to be higher than 350° C. On the other hand, in a bulk $BaTiO_3$ material, the polarization moment is 29 $\mu C/cm^2$ and the Curie temperature is 120° C. Therefore, the technique of crystal lattice elongation caused by epitaxial growth in a thin film region is an extremely useful technique for raising the polarization moment and Curie temperature. In particular, it can be said that $BaTiO_3$ has become a strong candidate for a ferroelectric memory material because of its ability to significantly increase its Curie temperature.

However, the trend towards high density, high capacity ferroelectric memory elements indicates that an even higher polarization moment than that achievable by the conventional technology is required. The reason is that, as the memory element becomes finer and the area of the capacitor decreases, a ferroelectric material comprising the memory layer is required to generate an even higher polarization moment in order to secure a charge level for activating the sensor amplifier.

SUMMARY OF THE INVENTION

A first object of the present invention is, therefore, to provide a ferroelectric memory element having a ferroelectric recording layer that can generate a high polarization moment and a high Curie temperature.

The next consideration relates to the epitaxial growth technique for improving the properties of $BaTiO_3$. As described in the description of the prior technologies, it is first necessary to form an oriented lower electrode comprising a perovskite-type oxide. However, because most ferroelectric memory elements are formed on an amorphous oxide, especially $SiO_2$, it has been difficult to form an oriented lower electrode having a perovskite-type oxide. For this reason, it has been a topic of investigation to find a method for producing an oriented film comprising a perovskite-type oxide even on an oxide material such as amorphous $SiO_2$ or SiOF. Further, another topic of investigation has been to use, in the recording layer, $BaTiO_3$ that has a trigonal crystal structure and that generates a higher polarization moment and a higher Curie temperature than those in a bulk material of $BaTiO_3$. Therefore, it is a second object of the present invention to provide a ferroelectric memory element having a ferroelectric recording layer comprising an electrode of an oriented film of a perovskite-type oxide that can be formed on an amorphous oxide, and a $BaTiO_3$ recording layer of a trigonal crystal structure formed by an epitaxial growth technique on top of the oxide layer, thereby resulting in a ferroelectric memory element having a ferroelectric recording layer that can generate a high polarization moment and a high Curie temperature originating from the extraordinarily high stresses caused by epitaxial growth.

Further, it is desirable to guarantee reliability of the memory element, especially a repeatability of over $10^{12}$ cycles. Therefore, a third object of the present invention is to provide a ferroelectric memory element having an electrode comprising an oriented film of a perovskite-type oxide that can be formed on an amorphous oxide, and a $BaTiO_3$ recording layer of a trigonal crystal structure formed by an epitaxial growth technique on top of the oxide layer, thereby resulting in a ferroelectric memory element having a ferroelectric recording layer that not only can generate a high polarization moment and a high Curie temperature originating from the extraordinarily high stresses caused by epitaxial growth, but can also provide a high reliability concerning the reading and writing repeatability.

A fourth object of the present invention is to provide an electronic apparatus which has a ferroelectric memory element such as described above.

Therefore, a first aspect of the present invention relates to a ferroelectric memory element having a recording layer comprising BaTiO$_3$ having a trigonal crystal structure and oriented in a <111> direction in a pseudo-cubic system so as to utilize a polarization moment in the <111> direction in a pseudo-cubic system for reading recorded signals.

Accordingly, a high polarization moment and a high Curie temperature are obtained in the recording layer.

In the ferroelectric memory element, the recording layer is formed preferably at a thickness of 50 nm or less.

Accordingly, the memory element in the first aspect can respond to the demand of the design rule of microelements of less than 0.10 μm in the thin film layer of the ferroelectric recording layer.

In the ferroelectric memory element in the first aspect, it is preferable that a unit cell of BaTiO$_3$ crystal structure is elongated in the <111> direction in a pseudo-cubic system, compared with a unit cell of a trigonal crystal structure of a bulk material of BaTiO$_3$ in a most stable state.

Accordingly, a high polarization moment and a high Curie temperature can be obtained in the recording layer.

In the ferroelectric memory element in the first aspect, it is preferable that a degree of elongation is not less than 2%.

Accordingly, a high polarization moment and a high Curie temperature are obtained in the recording layer.

In the ferroelectric memory element in the first aspect, it is preferable that a thickness of the recording layer is not more than 50 nm.

Accordingly, the memory element can respond to the demand of the design rule of microelements of less than 0.10 μm in the thin film layer of the ferroelectric recording layer.

A second aspect of the present invention relates to a ferroelectric memory element comprising a first electrode layer; a recording layer formed on top of the first electrode layer by laminating BaTiO$_3$ having a trigonal crystal structure in such a way so as to be oriented in a <111> direction in a pseudo-cubic system and to elongate a unit cell of the trigonal crystal structure in the <111> direction in a pseudo-cubic system to a level of not less than 2%, compared with a unit cell of a trigonal bulk material of BaTiO$_3$ in a most stable state; and a second electrode layer laminated on the recording layer, thereby allowing utilization of a polarization moment in the <111> direction in a pseudo-cubic system of the recording layer for reading recorded signals.

Accordingly, a high polarization moment and a high Curie temperature are obtained in the recording layer.

In the ferroelectric memory element in the second aspect, it is preferable that a thickness of the recording layer is not more than 50 nm.

Accordingly, the memory element can respond to the demand of the design rule of microelements of less than 0.10 μm in the thin film layer of the ferroelectric recording layer.

In the ferroelectric memory element, it is preferable that the first electrode layer and the second electrode layer comprise SrRuO$_3$. The first electrode layer and the second electrode layer may also comprise SrTiO$_3$ converted to an electrically conductive form.

By so doing, it is possible to elongate a unit cell in a <111> direction in a pseudo-cubic system compared with a unit cell of a trigonal bulk material of BaTiO$_3$ in a most stable state, and to achieve a level of elongation of not less than 2%.

A third aspect of the present invention relates to a ferroelectric memory element comprising a first electrode layer comprising a metallic material having a cubic system and oriented in a <111> direction; a second electrode layer, having a perovskite-type crystal structure and formed on the first electrode layer so as to be oriented in a <111> direction in a pseudo-cubic system; a recording layer comprising BaTiO$_3$ having a trigonal system and laminated on top of the second electrode layer so as to be oriented in a <111> direction in a pseudo-cubic system; and a third electrode layer laminated on top of the recording layer, thereby allowing utilization of a polarization moment generated in the <111> direction in a the pseudo-cubic system in the recording layer for reading recorded signals.

The structure described above allows the formation of an electrode of a perovskite-type structure oriented in a given direction even on an amorphous oxide substance, thereby allowing construction of a ferroelectric memory element having a recording layer, formed on top of the electrode layer, that provides a high polarization moment and a high Curie temperature. In particular, it allows the use of BaTiO$_3$ in a trigonal system that produces a high polarization moment in the recording layer.

In the ferroelectric memory element in the third aspect, it is preferable that a unit cell of BaTiO$_3$ crystal in the recording layer is elongated in the <111> direction in a pseudo-cubic system compared with a unit cell of a trigonal bulk material of BaTiO$_3$ in a most stable state.

The structure described above allows the formation of an electrode of perovskite-type structure oriented in a given direction even on an amorphous oxide substance, and a ferroelectric memory element can be provided in which a recording layer having a high polarization moment and a high Curie temperature is formed on the electrode on account of a powerful stress created by epitaxial growth on the electrode. In particular, this technique allows the use, in the recording layer, of BaTiO$_3$ in a trigonal system that provides a relatively higher polarization moment.

In the memory element in the third aspect, it is preferable that the first electrode layer comprises Pt having a face-centered-cubic structure. This is because it facilitates forming of a second electrode layer of a perovskite-type structure oriented in a pseudo-cubic system <111> direction to produce superior memory performance.

In the ferroelectric memory element in the third aspect, it is preferable that the first electrode layer comprises Pt and the second electrode layer comprises SrRuO$_3$. By so doing, it is possible to form a high quality second electrode layer of SrRuO$_3$ and to form a high quality recording layer comprising BaTiO$_3$ having a trigonal crystal structure and oriented in a <111> direction in a pseudo-cubic system to produce a high performance memory element.

In the ferroelectric memory element in the third aspect, it is preferable that the first electrode layer comprises Pt and the second electrode layer comprises SrTiO$_3$ converted to an electrically conductive form. In such a case also, it is possible to form a high quality SrTiO$_3$ second electrode layer and to form a high quality recording layer comprising BaTiO$_3$ having a trigonal crystal structure and oriented in a <111> direction in a pseudo-cubic system on top of the second electrode layer to provide a high performance memory element.

In the ferroelectric memory element in the third aspect, it is preferable that the first electrode layer is laminated on top of an amorphous oxide layer. According to the third aspect, the technique permits the formation of a first electrode layer, comprising a metallic material of a tetragonal structure and oriented in a <111> direction, on the amorphous oxide layer; the formation of a second electrode layer on top of the first electrode layer, comprising a perovskite-type structure and oriented in the <111> direction in a pseudo-cubic system; and the formation of a recording layer, comprising BaTiO$_3$ having a trigonal crystal structure and oriented in the <111> direction in a pseudo-cubic system, or the formation of a recording layer comprising BaTiO$_3$ having a trigonal system and oriented in the <111> direction in a pseudo-cubic system and also elongated in the <111> direction in a pseudo-cubic system. Such a ferroelectric memory element provides a high performance.

A fourth aspect of the present invention relates to a ferroelectric memory element comprising a first electrode layer comprising Ir or an Ir oxide; a second electrode layer, comprising Pt having a face-centered-cubic structure and formed on the first electrode layer so as to be oriented in a <111> direction; a third electrode layer, having a perovskite-type crystal structure and formed on the second electrode layer so as to be oriented in a <111> direction in a pseudo-cubic system; a recording layer, comprising BaTiO$_3$ having a trigonal crystal structure and formed on top of the third electrode layer so as to be oriented in a <111> direction in a pseudo-cubic system; and a fourth electrode layer, having a perovskite-type crystal structure and laminated on top of the recording layer so as to be oriented in a <111> direction in a pseudo-cubic system; wherein a unit cell of a crystal structure of BaTiO$_3$ in the recording layer is elongated in the <111> direction in a pseudo-cubic system compared with a unit cell of a bulk material of BaTiO$_3$ in a trigonal system which represents the most stable state, thereby allowing utilization of a polarization moment generated in the <111> direction in a pseudo-cubic system in the recording layer for reading recorded signals.

According to the structure described above, it is possible to form an electrode of a perovskite-type structure oriented in a given direction, even on an amorphous oxide substance, and to form a recording layer on top of the electrode layer to produce a high polarization moment and a high Curie temperature to provide a high performance ferroelectric memory element. In particular, it becomes possible to use BaTiO$_3$ in a trigonal system having a relatively large polarization moment. Also, the electrode layer comprising Ir acts as a barrier layer for the diffusion of oxygen so that the reliability of performance of the memory element over repeated recording cycles is improved.

In the ferroelectric memory element in the fourth aspect, it is preferable that the third electrode layer comprises SrRuO$_3$. This technique allows the formation of a third electrode layer of high performance using SrRuO$_3$ and the formation of a high performance recording layer comprising BaTiO$_3$ having a trigonal crystal structure on top of the SrRuO$_3$ electrode layer that is oriented and elongated in a <111> direction in a pseudo-cubic system.

In the ferroelectric memory element in the fourth aspect, it is preferable that the third electric layer comprises SrTiO$_3$ converted to an electrically conductive form. In such a case also, it is possible to form a SrTiO$_3$ third electrode layer and to form a recording layer comprising BaTiO$_3$ oriented in a <111> direction in a pseudo-cubic system and elongated in the direction.

In the ferroelectric memory element in the fourth aspect, it is preferable that the first electrode layer is laminated on top of an amorphous oxide layer. This technique in the fourth aspect allows the formation of a first electrode layer comprising Ir or an Ir oxide on top of an amorphous oxide substance, the formation of a second electrode layer comprising Pt having a face-centered-cubic structure and oriented in the <111> direction on the first electrode layer, the formation of a third electrode layer comprising a perovskite-type structure and oriented in the <111> direction in a pseudo-cubic system on top of the second electrode layer, the formation of a recording layer comprising BaTiO$_3$ having a trigonal crystal structure and oriented in a <111> direction in a pseudo-cubic system and elongated in a <111> direction in a pseudo-cubic system, and the formation of a fourth electrode layer comprising a perovskite-type structure and oriented in a <111> direction in a pseudo-cubic system on top of the recording layer, thereby providing a high performance ferroelectric memory element.

In the ferroelectric memory element in the fourth aspect, it is preferable that the fourth electrode layer is overlaid with a fifth electrode layer comprising Ir or an Ir oxide. By so doing, resistance to reduction of the recording layer is improved so that the margin of the semiconductor manufacturing process is widened.

In a fifth aspect of the present invention, an electronic apparatus is provided which has the above-described ferroelectric memory element. Since this electronic apparatus has a superior memory element such as described above, it is compact, and has recording data that is highly reliable.

Summarizing the features of the present invention, the invention provides a high performance ferroelectric memory element by fabricating a recording layer comprising BaTiO$_3$ having a trigonal crystal structure and oriented in a <111> direction in a pseudo-cubic system, thereby allowing utilization of the polarization moment produced in the <111> direction in a pseudo-cubic system for reading recorded signals. The present invention can thus provide a ferroelectric memory element having a high polarization moment and a high Curie temperature in a thin region in which the film thickness of the recording layer comprising a ferroelectric material is 50 nm or less and an electronic apparatus provided with this ferroelectric memory element.

DESCRIPTION OF THE PREFERRED EMBODIMENTS

Embodiment 1

Figure 1:
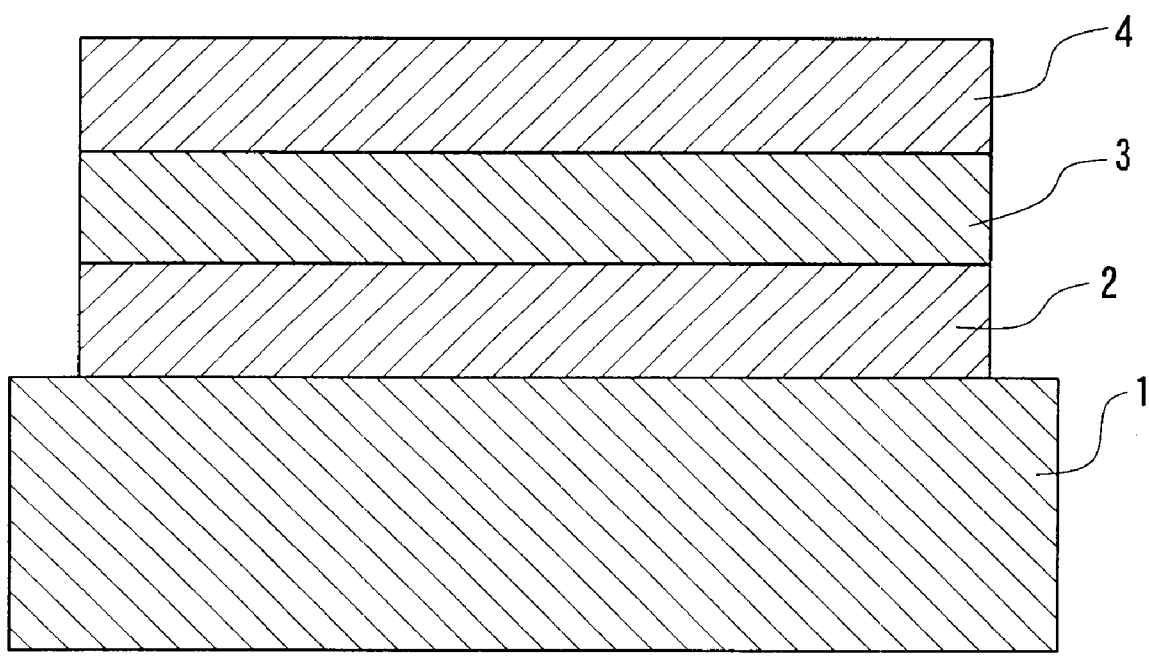
FIG. 1 is a lateral cross sectional view of a ferroelectric memory element in Examples 1 and 2.

FIG. 1 shows a cross sectional view of a ferroelectric memory element in Embodiment 1. In this diagram, reference numeral 1 relates to a substrate plate; 2 to an electrode layer formed on top of the substrate plate 2; 3 to a recording layer formed on the electrode layer 2; and 4 to an electrode layer formed on top of the recording layer 3.

An oxide having a perovskite-type structure such as $SrTiO_3$ or $CaTiO_3$ may be used for the substrate 1. The layer may be oriented in a <111> direction in a pseudo-cubic system.

The electrode layer 2 may comprise a material such as $SrRuO_3$, $LaSrMnO_3$ or $SrTiO_3$ converted to an electrically conductive form by adding dopants such as Nb or La, to a level of about 0.1 to 5 atomic percent (a/o). It is preferable that the thickness of this layer be 10 to 500 nm, or more preferably 20 to 300 nm. When this layer is too thin, it is not desirable because the electrical resistance of the layer becomes excessive and the power consumption of the electronic devices using the memory elements increases. Also, it becomes impossible to elongate the lattice of $BaTiO_3$ deposited on top of the layer. If this layer is too thick, the duration of film formation becomes excessive, leading to an increase in the cost. When the memory element is made finer, the aspect ratio in the height direction is increased, and it becomes difficult to manufacture the memory element in a stable manner.

This layer may be oriented in a <111> direction in a pseudo-cubic system.

The recording layer 3 is $BaTiO_3$ having a trigonal crystal structure and is oriented in a <111> direction in a pseudo-cubic system. The thickness of this layer is 2 to 50 nm. This is because when the thickness of this layer becomes less than 2 nm or greater than 50 nm, the polarization moment decreases rapidly.

The thickness of this layer is more preferably 5 to 30 nm. This is to meet the needs of thin films of ferroelectric layer in the gigabit memory range.

Also, it is preferable that the unit cell of the crystal be elongated in a <111> direction in a pseudo-cubic system to a level exceeding 2%. When the amount of the elongation is greater than 2%, the polarization moment exceeds that of the bulk material significantly. However, it is difficult in manufacturing to increase the amount of elongation in excess of 8%.

The electrode layer 4 may comprise materials such as $SrRuO_3$, $LaSrMnO_3$ or $SrTiO_3$ made electrically conductive by adding dopants such as Nb, La. It is preferable that the thickness of this layer be 10 to 500 nm, or more preferably 20 to 300 nm. When the layer is too thin, it is not desirable because the electrical resistance of the layer becomes excessive and the power consumption of the electronic devices using the memory elements increases. If this layer is too thick, the duration of film formation becomes excessive, leading to an increase in the cost. When the memory element is made finer, the aspect ratio in the height direction is increased, and it becomes difficult to manufacture the memory element in a stable manner.

The orientations of the layers described above are such that when the orientation of the substrate plate 1 is in a <111> direction in a pseudo-cubic system, the orientation of the electrode layer 2 is in the <111> direction in a pseudo-cubic system, the orientation of the recording layer on top is in the <111> direction in a pseudo-cubic system, and the orientation of the electrode layer 4 above is also in the <111> direction in a pseudo-cubic system.

These layers may be formed by means of laser ablation, sputtering, MBE, CVD and the like. It is preferable that the film formation temperature be in a range of 500 to 800° C.

Embodiment 2

Figure 4:
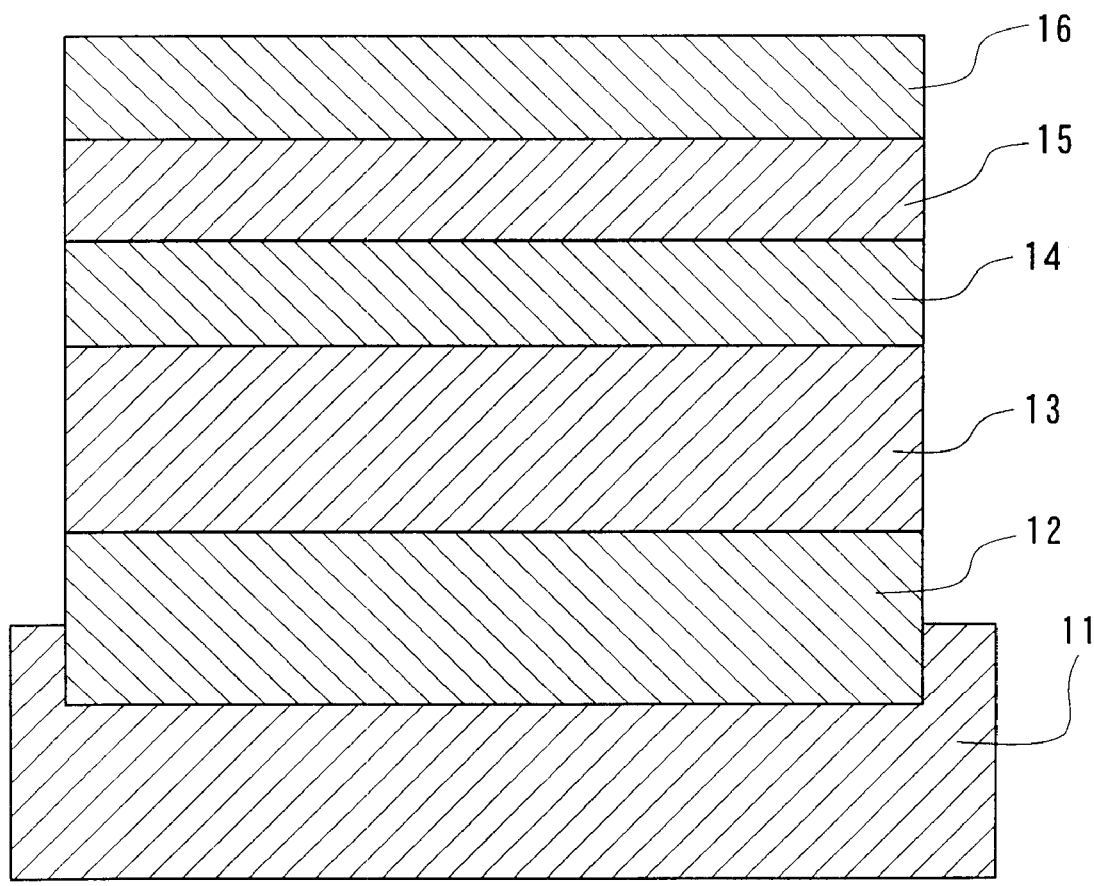
FIG. 4 is a lateral cross sectional view of a ferroelectric memory element in Example 4 and 5.

FIG. 4 shows a cross sectional view of a ferroelectric memory element in Embodiment 2. In this diagram, reference numeral 11 relates to a substrate plate; 12 to an amorphous layer deposited on top of the substrate 11; 13 to a first electrode layer oriented in a <111> direction and comprising a metal formed on top of the amorphous layer 12; 14 to a second electrode layer deposited on top of the first electrode layer 13 and having a perovskite-type structure oriented in the <111> direction in a pseudo-cubic system; 15 to a recording layer comprising $BaTiO_3$ having a trigonal crystal structure formed on top of the second electrode layer 14 and oriented in the <111> direction in a pseudo-cubic system; 16 to a third electrode layer formed on top of the recording layer 15 having a perovskite type structure and oriented in the <111> direction in a pseudo-cubic system.

The substrate plate 11 can be a single Si crystal, Si—Ge crystal, and the like that are cut to expose the (001), (111) or (110) surface. The orientation direction of this layer can be <001>, <111> or <110>.

The amorphous layer 12 can comprise $SiO_2$, SiOF, and the like. It is preferable that the thickness of this amorphous layer be in a range of 10 to 200 nm.

When the substrate plate 11 comprises a single Si crystal, the $SiO_2$ amorphous layer 12 can be easily prepared by thermally oxidizing the surface. In this invention, the $SiO_2$ layer so formed is also described as a laminated layer.

The first electrode layer 13 comprising a metallic material oriented in a <111> direction can be Pt or the like. It is preferable that the thickness of this electrode layer 13 be in a range of 10 to 500 nm. Further, it is more preferable that the thickness be in a range of 20 to 300 nm.

The electrode can be formed by methods such as sputtering and the like. It is preferable that, in this case, the film formation temperature be in a range of 0 to 100° C.

The second electrode layer 14 oriented in a <111> direction in a pseudo-cubic system of a perovskite-type structure can be $SrRuO_3$, $LaSrMnO_3$ or $SrTiO_3$ made electrically conductive by adding dopants such as and Nb or La. It is preferable that the thickness of this layer be in a range of 10 to 500 mn, or more preferably in a range of 20 to 300 nm. When the layer thickness is too thin, the electrical resistance of the layer increases, and it is not desirable because the electrical resistance of the layer becomes excessive and the power consumption of the electronic devices using the memory elements increases. Also, it becomes impossible to elongate the lattice of $BaTiO_3$ to be laminated above the layer. When the thickness of this layer is excessive, the film forming time increases, leading to an increase in the cost. When the memory element is made finer, the aspect ratio in the height direction is increased, and it becomes difficult to manufacture the memory element in a stable manner.

The layer 14 may be oriented in the <111> direction in a pseudo-cubic system.

The recording layer 15 is formed on top of the second electrode layer, and comprises $BaTiO_3$ having a trigonal crystal structure and oriented in the <111> direction in a pseudo-cubic system. Regarding the thickness of this layer 15 and elongation the unit cell in the <111> direction in a pseudo-cubic system, the same can be said as in Embodiment 1.

The third electrode layer 16 laminated on top of the recording layer 15 and oriented in the <111> direction in a pseudo-cubic system of a perovskite-type structure can be SrRuO$_3$, LaSrMnO$_3$ or SrTiO$_3$ made electrically conductive by adding dopants such as Nb or La. It is preferable that the thickness of this layer be in a range of 10 to 500 nm, or more preferably in a range of 20 to 300 nm. When the layer thickness is too thin, the electrical resistance of the layer increases, which would not be preferable because the power consumption of the electronic devices using the ferroelectric memory elements increases. When the thickness of this layer is excessive, the film forming time increases, leading to an increase in the cost. When the memory element is made finer, the aspect ratio in the height direction is increased, and it becomes difficult to manufacture the memory element in a stable manner.

The second electrode 14, recording layer 15 and third electrode 16 may be formed by means of laser ablation, sputtering, MBE, CVD or the like. It is preferable that the film formation temperature be in a range of 500 to 800° C.

Embodiment 3

Figure 6:
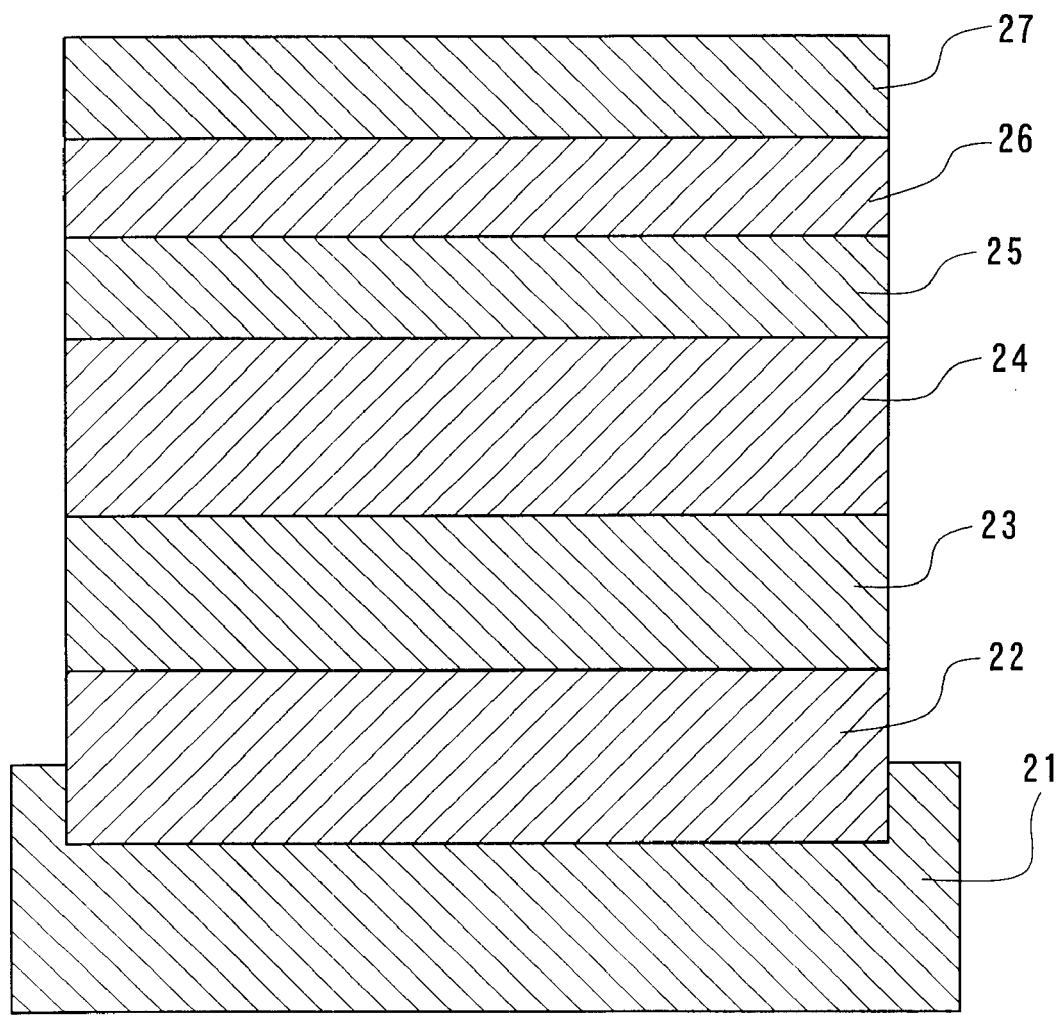
FIG. 6 is a lateral cross sectional view of a ferroelectric memory element in Example 6.

FIG. 6 shows a cross sectional view of the memory structure in Embodiment 3. In this diagram, reference numeral 21 relates to a substrate plate; 22 to an amorphous layer formed on top of the substrate plate 21; 23 to a first electrode layer comprising Ir or an Ir oxide and laminated on top of the amorphous layer 22; 24 to a second electrode layer comprising Pt laminated on top of the first electrode layer 23 and oriented in a <111> direction in a face-centered-cubic structure; 25 to a third electrode layer of a perovskite-type structure laminated on top of the second electrode layer 24 and oriented in the <111> direction in a pseudo-cubic system; 26 to a recording layer comprising BaTiO$_3$ having a trigonal crystal structure laminated on top of the third electrode layer 25 and oriented in the <111> direction in a pseudo-cubic system; and 27 to a fourth electrode layer of a perovskite-type structure laminated on top of the recording layer 26 and oriented in the <111> direction in a pseudo-cubic system.

The unit cell of the BaTiO$_3$ crystal structure is elongated in the pseudo-cubic system <111> direction compared with the most stable trigonal crystal structure of a bulk material of BaTiO$_3$ in a trigonal crystal structure, and the polarization moment in a pseudo-cubic system <111> direction in the recording layer mentioned above is used for recording the signals.

The substrate plate 21 can comprise a single Si crystal, Si—Ge crystal, and the like that are cut to expose the (001), (111) or (110) surface. The orientation direction of this layer can be <001>, <111> or <110>.

The amorphous layer 22 can be SiO$_2$, SiOF and the like. It is preferable that the thickness of this amorphous layer be in a range of 10 to 200 nm.

When the substrate plate 21 comprises a single crystal of Si, the SiO$_2$ amorphous layer 12 can be easily prepared by thermally oxidizing the surface. In this invention, the SiO$_2$ layer 22 so formed is also described as a laminated layer.

In Embodiment 3, on top of the amorphous layer, an oxide layer 23 comprising Ir or an Ir oxide is formed first. Because of the presence of this layer, it is possible to provide a memory element of superior performance in reproduction cycles compared with a memory element produced by laminating Pt directly on the amorphous layer. It is preferable that the layer thickness be in a range of 10 to 500 nm, or more preferably, in a range of 20 to 300 nm.

The second electrode layer 24, comprising a metallic material, laminated on top of the Ir or an Ir oxide and oriented in the <111> direction may comprise Pt. It is preferable that the thickness of the second electrode layer be in a range of 10 to 500 nm. It is even more preferable that the thickness be in a range of 20 to 300 nm.

The first and second electrode layers 23, 24 may be produced by a method such as sputtering. It is preferable that the film formation temperature be in a range of 0 to 100° C.

The third electrode layer 25 of a perovskite-type structure oriented in the <111> in a pseudo-cubic system direction can be SrRuO$_3$, LaSrMnO$_3$ or SrTiO$_3$ made electrically conductive by adding dopants such as Nb or La. It is preferable that the thickness of this layer be in a range of 10 to 500 nm, or more preferably in a range of 20 to 300 nm. When the layer thickness is too thin, the electrical resistance of the layer increases, which would not be preferable because the power consumption of the electronic devices using the ferroelectric memory elements increases. Also, it becomes impossible to elongate the lattice constant of BaTiO$_3$ to be laminated above the layer. When the thickness of this layer is excessive, the film forming time increases, leading to an increase in the cost. Also, when the memory element is made finer, the aspect ratio in the height direction is increased, and it becomes difficult to manufacture the memory element in a stable manner.

The recording layer 26 is formed on top of the third electrode layer 25, and comprises BaTiO$_3$ having a trigonal crystal structure and oriented in the <111> direction in a pseudo-cubic system. Regarding the thickness of this layer and elongation the unit cell in the <111> direction in a pseudo-cubic system, the same can be said as in Embodiment 1.

The fourth electrode layer 27 is laminated on top of the recording layer 26, and has a perovskite-type structure oriented in the <111> direction in a pseudo-cubic system. The fourth electrode layer 27 can be SrRuO$_3$, LaSrMnO$_3$ or SrTiO$_3$ made electrically conductive by adding dopants such as Nb or La. It is preferable that the thickness of this layer be in a range of 10 to 500 nm, or more preferably in a range of 20 to 300 nm. When the layer thickness is too thin, the electrical resistance of the layer increases, which would not be preferable because the power consumption of the electronic devices using the ferroelectric memory elements increases. When the thickness of this layer is excessive, the film forming time increases, leading to an increase in the cost. Also, when the memory element is made finer, the aspect ratio in the height direction is increased, and it becomes difficult to manufacture the memory element in a stable manner.

The third electrode layer 25, recording layer 26 and fourth electrode layer 27 may be formed by means of laser ablation, sputtering, MBE, CVD or the like. It is preferable that the film formation temperature be in a range of 500 to 800° C.

Embodiment 4

Embodiment 4 is a ferroelectric memory apparatus provided with a ferroelectric memory element which is similar to the ferroelectric memory element of Embodiment 2 above.

Figure 7:
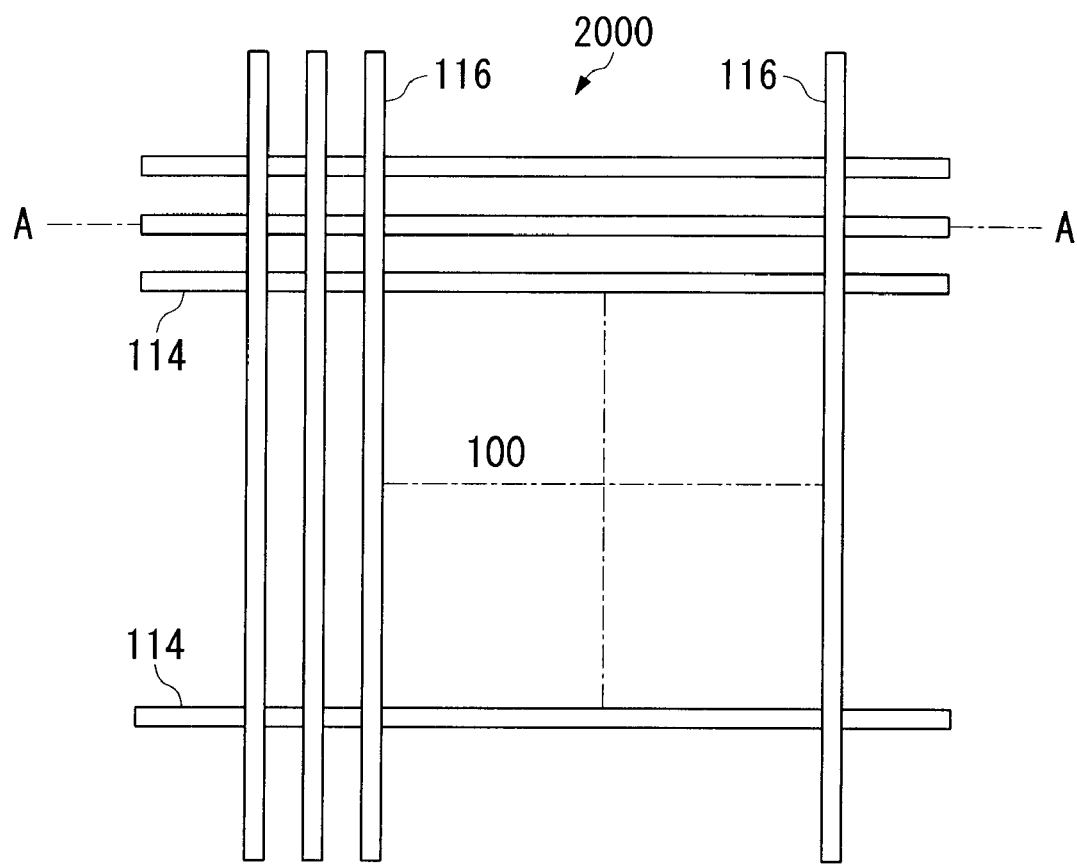
FIG. 7 is a plan view schematically showing a ferroelectric memory apparatus of Embodiment 4.
Figure 8:
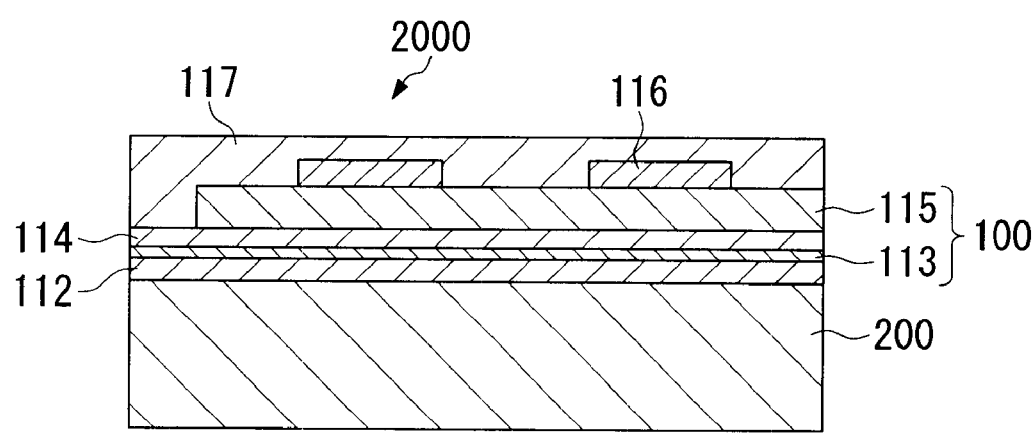
FIG. 8 is a cross sectional view of A—A in FIG. 7.

FIG. 7 is a plan view schematically showing a ferroelectric memory apparatus 2000 in Embodiment 4. Furthermore, FIG. 8 is a cross sectional view schematically showing the portion along A—A of FIG. 7.

In these figures, 100 is a matrix-like memory cell array, and 200 is a peripheral circuit including an MOS transistor for selecting a memory cell. The topmost part of the peripheral circuit 200 is an amorphous layer 112 of an interlaminar insulating film in which a protective layer is combined. 113 is a first electrode layer comprising a metal laminated on the amorphous layer 112 and oriented in the <111> direction. 114 is a second electrode layer comprising a perovskite-type structure laminated on the first electrode layer 113 and oriented in a <111> direction in a pseudo-cubic system. 115 is a recording layer comprising $BaTiO_3$ having a trigonal crystal structure formed on the second electrode layer and oriented in the <111> direction in a pseudo-cubic system. 116 is a third electrode layer comprising a perovskite-type structure laminated on the recording layer 115 and oriented in a <111> direction in a pseudo-cubic system. 117 is a protective layer formed on the recording layer 115 and on the third electrode layer 116.

The above-mentioned first electrode layer 113, second electrode layer 114, recording layer 115, and third electrode layer 116 can be formed based on the method of Embodiment 2.

The protective layer 117 formed on the recording layer 115 and third electrode layer 116 can be made from $SiO_2$.

The thin film composed of an oxide or a nitride as these protective layers can be formed by a method such as a laser ablation method, a CVD method, and the like.

The intersecting parts of the second electrode and third electrode described above correspond to the ferroelectric memory element of Embodiment 2 described above.

Embodiment 5

Embodiment 5 is a ferroelectric memory apparatus provided with a ferroelectric memory element similar to the ferroelectric memory element of Embodiment 3 above.

Figure 9:
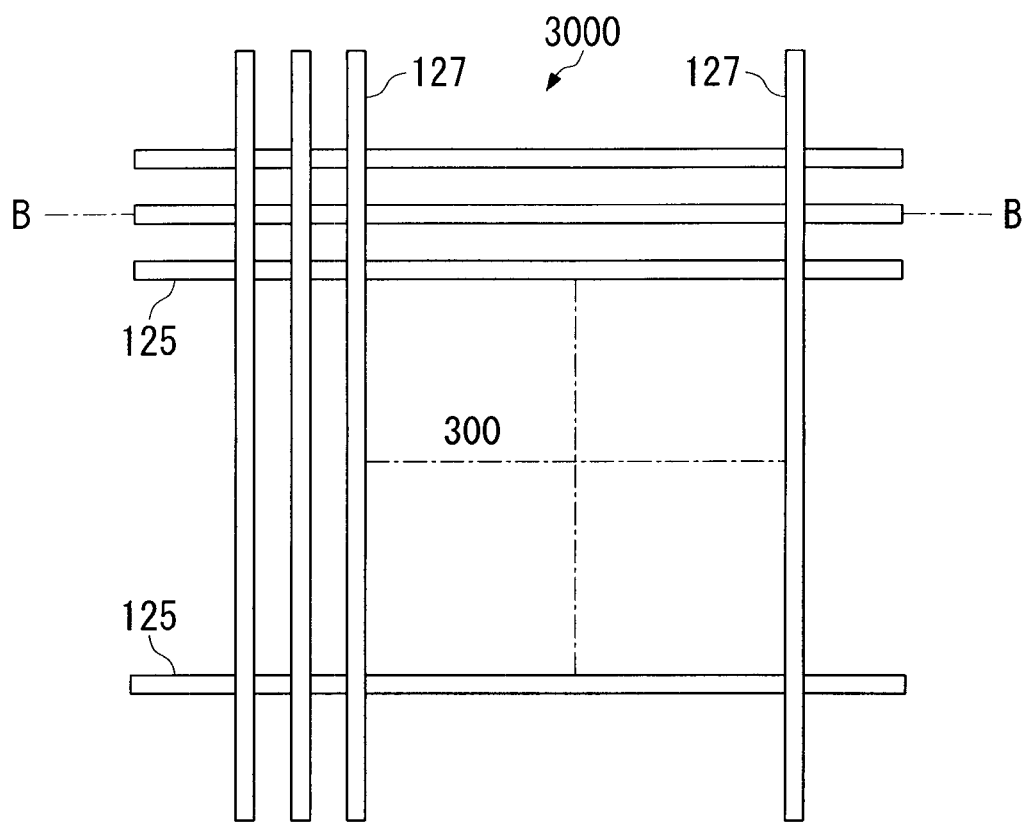
FIG. 9 is a plan view schematically showing a ferroelectric memory apparatus of Embodiment 5.
Figure 10:
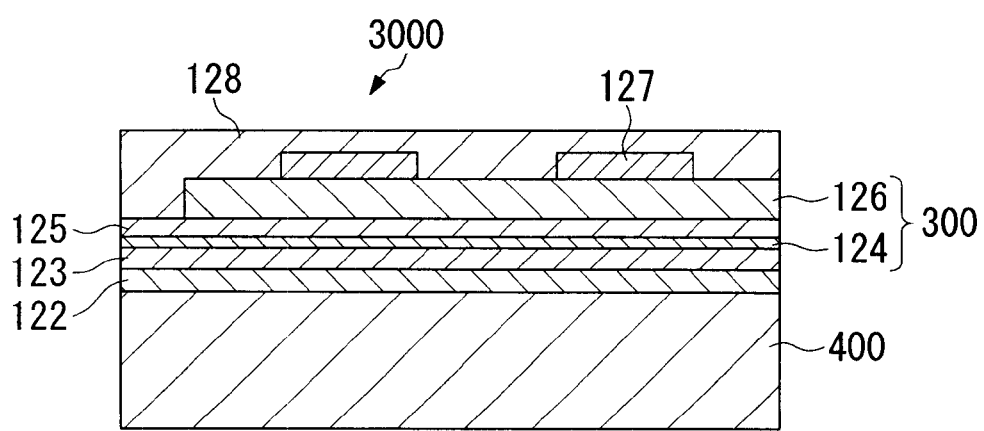
FIG. 10 is a cross sectional view of B—B in FIG. 9.

FIG. 9 is a plan view schematically showing a ferroelectric memory apparatus 3000 in Embodiment 5. Furthermore, FIG. 10 is a cross sectional view schematically showing the portion along B—B in FIG. 9.

In these figures, 300 is a matrix-like memory array, and 400 is a peripheral circuit including an MOS transistor for selecting a memory cell. The topmost part of the peripheral circuit 400 is an amorphous layer 122 of an interlaminar insulating film in which a protective layer is combined. 123 is a first electrode layer comprising Ir or an Ir oxide laminated on the amorphous layer 122. 124 is a second electrode layer made of Pt laminated on the first electrode layer 123 having a face-centered-cubic structure and oriented in the <111> direction. 125 is a third electrode layer comprising a perovskite-type structure laminated on the second electrode layer 124 and oriented in a <111> direction in a pseudo-cubic system. 126 is a recording layer comprising $BaTiO_3$ having a trigonal crystal structure laminated on the third electrode layer 125 and oriented in a <111> direction in a pseudo-cubic system. 127 is a fourth electrode layer comprising a perovskite-type structure laminated on the recording layer 126 and oriented in a <111> direction in a pseudo-cubic system. 128 is a protective layer formed on the recording layer 126 and on the fourth electrode layer 127.

The unit cell in the crystal structure of $BaTiO_3$ of the recording layer 126 is elongated in the <111> direction in a pseudo-cubic system compared with a unit cell of trigonal bulk material of $BaTiO_3$ in most stable state, and the polarization moment of the <111> direction in a pseudo-cubic system in the recording layer is used in the recording of a signal. The above-mentioned first electrode layer 123, second electrode layer 124, third electrode layer 125, recording layer 126, fourth electrode layer 127, and protective layer 128 can be formed based on the method of Embodiment 3.

The protective layer 128 formed on the recording layer 126 and third electrode 127 can be made from $SiO_2$.

The thin layer comprising an oxide or a nitride as these protective layers can be formed by a method such as a laser ablation method, a CVD method, and the like.

The intersecting parts of the third electrode and fourth electrode correspond to the ferroelectric memory element of Embodiment 3 described above.

Embodiment 6

Embodiment 6 is an example of a ferroelectric memory apparatus of Embodiment 4 or 5 described above, and is thus an electronic apparatus provided with a ferroelectric memory element of Embodiment 2 or 3 described above.

Figure 11A:
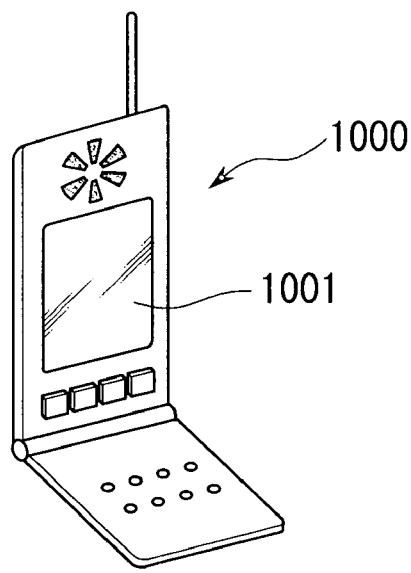
FIGS. 11A to 11C are perspective views showing an electronic apparatus of Embodiment 6.

FIG. 11A is a perspective view showing one example of a portable telephone. In FIG. 11A, reference numeral 1000 indicates a portable telephone main body, and a memory portion 1001 is provided therein which uses the ferroelectric memory apparatus described above.

Figure 11B:
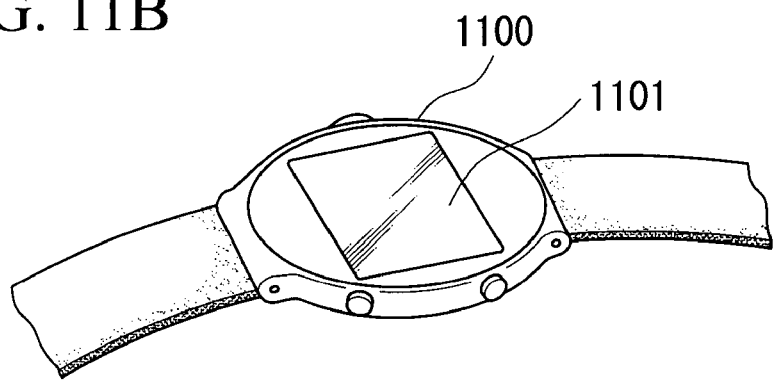

FIG. 11B is a perspective view showing one example of a watch-type electronic apparatus. In FIG. 11B, reference numeral 1100 indicates a watch main body, and a memory portion 1101 is provided therein which uses the ferroelectric memory apparatus described above.

Figure 11C:
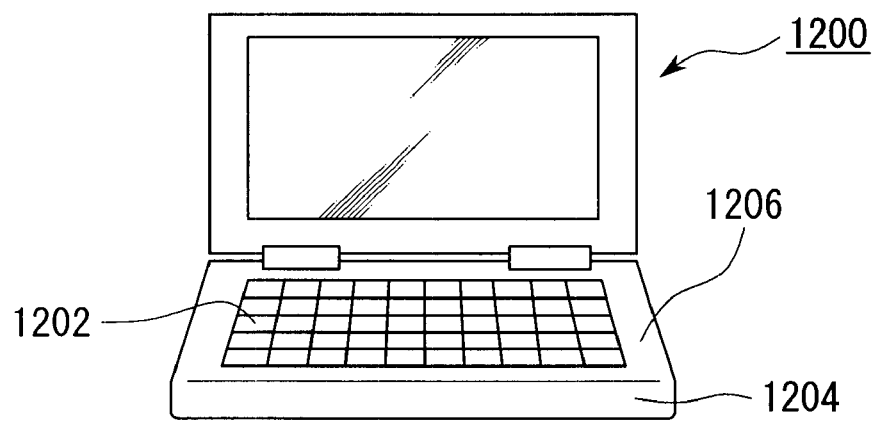

FIG. 11C is a perspective view showing one example of a portable type information processing apparatus such as a word processor, personal computer, and the like. In FIG. 11C, reference numeral 1200 indicates an information processing apparatus. Reference numeral 1202 indicates an input portion such as a keyboard. Reference numeral 1204 indicates an information processing apparatus main body, and a memory portion 1206 is provided therein which uses the ferroelectric memory apparatus described above.

Furthermore, as other examples of electronic apparatuses, although not illustrated, so-called IC cards can also be adopted in which a memory portion which uses the ferroelectric memory apparatus described above is provided.

The electronic apparatuses (including IC cards) shown in FIGS. 11A to 11C are provided with a ferroelectric memory apparatus shown in the above-mentioned examples. Therefore, it is possible to realize a small-size, highly-reliable electronic apparatus.

Moreover, the technical scope of the present invention is not limited to the above-mentioned examples, and it is possible to add various changes as long as they do not depart from the gist of the present invention.

For example, as the above-mentioned ferroelectric memory apparatus, a so-called 1T1C-type memory cell which is formed of one MOS transistor and one capacitor, or a so-called 2T2C-type memory cell which is formed of two MOS transistors and two capacitors can also be adopted.

In the following, some examples of the memory element will be explained with reference to the drawings.

EXAMPLE 1

FIG. 1 shows a lateral cross sectional view of a ferroelectric memory element in Example 1. The electrode layer 2 was formed by laminating $SrRuO_3$ on a $SrTiO_3$ substrate 1 cut to expose a (111) surface. The recording layer 3 was produced by laminating $BaTiO_3$ on the electrode layer 2. Further, the electrode layer 4 was produced by laminating $SrRuO_3$ on top of the recording layer 3. The film thicknesses of the electrode layer 2, recording layer 3 and electrode layer 4 were 200, 20 and 200 nm, respectively. The electrode layer 2, recording layer 3 and electrode layer 4 were produced by means of laser ablation. The film forming operations were carried out in all cases under the conditions of the substrate temperature at 700° C. and an oxygen partial pressure at 400 mPa (3 mTorr).

X-ray diffraction results showed that the recording layer 3 comprising $BaTiO_3$ has a trigonal crystal structure and was oriented in a <111> direction in a pseudo-cubic system. The unit cell was found to be elongated in a <111> direction in a pseudo-cubic system by about 6% compared with a bulk trigonal crystal in the base state (the most stable structure at cryogenic temperatures). For interest, the unit cell constant "a" of a bulk crystal of $BaTiO_3$ in the stable state of a trigonal crystal structure is 400 pm and the angle a is 89 degrees and 51 minutes. Also, the crystal structures of $SrRuO_3$ in the electrode layers 2 and 4 were oriented in the <111> direction in a pseudo-cubic system.

The polarization moment thus obtained was 51 $\mu C/cm^2$. The Curie temperature was higher than 300° C. The polarization moment of the recording layer 3 was directed in the <111> direction in a pseudo-cubic system. This result can be verified also by the fact that this result substantially matches the value of 55 $\mu C/cm^2$ of the polarization moment at 6% elongation obtained by the computation in Example 3 to be described later. The polarization moment obtained in Example 1 is higher than the value of 35 $\mu C/cm^2$ reported in the previously-noted publication in the Japanese Journal of Applied Physics, Vol. 38, (1999), pp. 5305. It can be said, therefore, that, in $BaTiO_3$, elongation of unit cell in the trigonal crystal is more advantageous than elongation in the tetragonal crystal symmetry, from the viewpoint of a greater gain in the polarization moment.

In the memory element produced in Example 1, a structural phase transition did not take place in a range from −10 to 100° C.

In this example, the electrode layers 2 and 4 are not limited to $SrRuO_3$. The same effects are obtained using $SrTiO_3$ made electrically conductive by adding a dopant. As the dopants to be added to $SrTiO_3$, it is preferable to use Nb or La in a range of 0.1 to 5.0 a/o. The base material comprising $SrTiO_3$ has a tetragonal symmetry and a lattice constant of 391 pm, and the recording layer 3 comprising $BaTiO_3$ laminated on the base material receives about the same degree of lattice distortion (elongation), at a level of 6 to 7%, as the distortion generated when the base material comprises $SrRuO_3$.

In this Example 1, the same effects are observed when grain boundaries are present in the electrode layer 2. In this context, the recording layer 3 formed on the electrode layer 2 in this example can be said to be formed by epitaxial growth, judging from the observation that the recording layer 3 grows while retaining the lattice strain.

EXAMPLE 2

In this example, a relationship between the film thickness of $BaTiO_3$ and the polarization moment will be examined.

FIG. 1 shows a lateral cross sectional view of a ferroelectric memory element in Example 1. The electrode layer 2 was formed by laminating $SrRuO_3$, oriented in a <111> direction in a pseudo-cubic system, on a $SrTiO_3$ substrate 1 cut to expose a (111) surface. The recording layer 3 was produced by epitaxially growing $BaTiO_3$, having a trigonal crystal structure and oriented in the <111> direction in a pseudo-cubic system, on the electrode layer 2. Further, the electrode layer 4 was produced by laminating $SrRuO_3$, oriented in the <111> direction in a pseudo-cubic system, on top of the recording layer 3. The film thicknesses of the electrode layer 2, recording layer 3 and electrode layer 4 were 200, X and 200 nm, respectively. In this Example 2, the film thickness X was varied between 5 nm and 80 nm. The electrode layer 2, recording layer 3 and electrode layer 4 were produced by means of laser ablation. The film forming operations were carried out in all cases under the conditions of the substrate temperature at 700° C. and an oxygen partial pressure at 400 mPa (3 mTorr).

Figure 2:
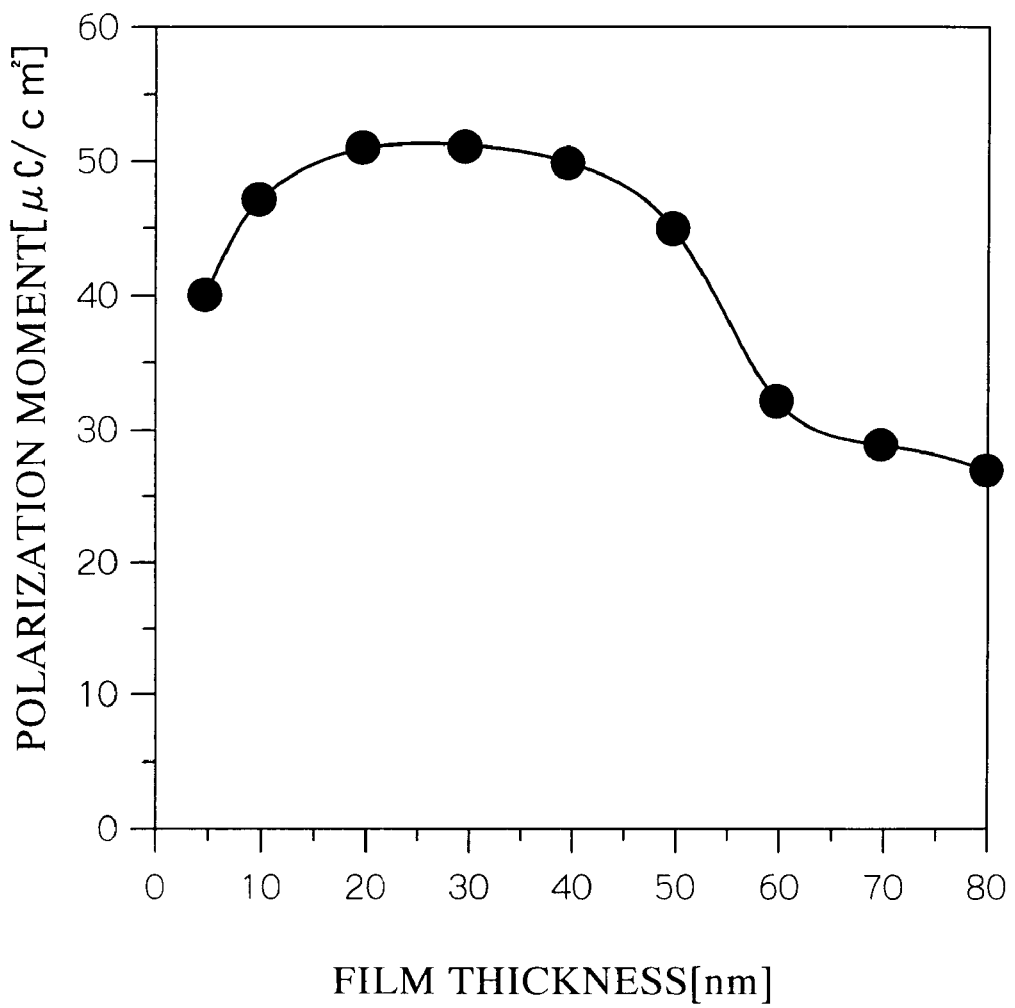
FIG. 2 is a diagram showing a relationship of the thickness of the recording layer to the polarization moment in Example 2.

FIG. 2 shows a relationship between the film thickness X and the polarization moment. It can be seen in FIG. 2 that, when the thickness of the recording layer 3 exceeds 50 nm, the value of the polarization moment begins to decrease rapidly. This is because, when the film thickness of the recording layer 3 exceeds 50 nm, lattice relaxation occurs so that epitaxial growth cannot be continued. In other words, when the film thickness exceeds such a value, the lattice constant returns to the value in the bulk material. This was demonstrated by the fact that, when the film thickness of the recording layer 3 exceeded 50 nm, the sharpness of X-ray diffraction patterns decreased. Therefore, it is preferable that the film thickness of the recording layer 3 be less than 50 nm to maintain the epitaxial growth mode, that is, to grow an epitaxial crystal while maintaining the strained lattice based on the lattice constant of the base crystal.

EXAMPLE 3

Example 3 shows a relationship between the degree of unit cell elongation h in the direction of the polarization axis of $BaTiO_3$ and the polarization moment, obtained by electron state simulation according to a primary computational technique.

As a primary computational method, single-electron equations were solved according to the density functional theory within the local density approximation (the full-potential linearized augmented plane wave method, known as FLAPW method), which leads to optimization of the structure according to the total energy and forces acting on the atoms. Then, the polarization is obtained from the Berry phase of the derived wave functions. In this case, the computational precision was confirmed by obtaining a polarization moment in $NaNO_3$ which is an example of a ferroelectric material. The value computed was 11.6 $\mu C/cm^2$ compared with an experimental value of 11.9 $\mu C/cm^2$. Therefore, it can be seen that the computational method used in Example 3 simulates the polarization moment of a ferroelectric body obtained by experimentation very well.

Compression and elongation of the crystal axis were performed in the pseudo-cubic system <111> direction to correspond with the polarization axis in reference to the base state crystal structure of $BaTiO_3$ having a trigonal crystal structure (lattice constant "a" is 400 pm and angle a is 89 degrees and 51 minutes). Here, the relation between the amount h of elongation in the <111> direction in a pseudo-cubic system of the unit cell and the amount of elongation within a plane at right angles to the <111> direction in a pseudo-cubic system was determined by assuming 0.3 for Poisson's ratio which is generally obtained for oxide materials. For each h, the positions of the internal atoms contained in the unit cell are obtained by optimizing so as to minimize the forces acting on the atoms (below 0.001 Ry/Bohr). Also, a 25 Ry plane-wave cutoff and a k-point mesh (4×4×4) were used to obtain an optimization of the internal atom positions, and a 15 Ry cutoff and a k-point mesh (4×4×20) to obtain the Berry phase.

Figure 3:
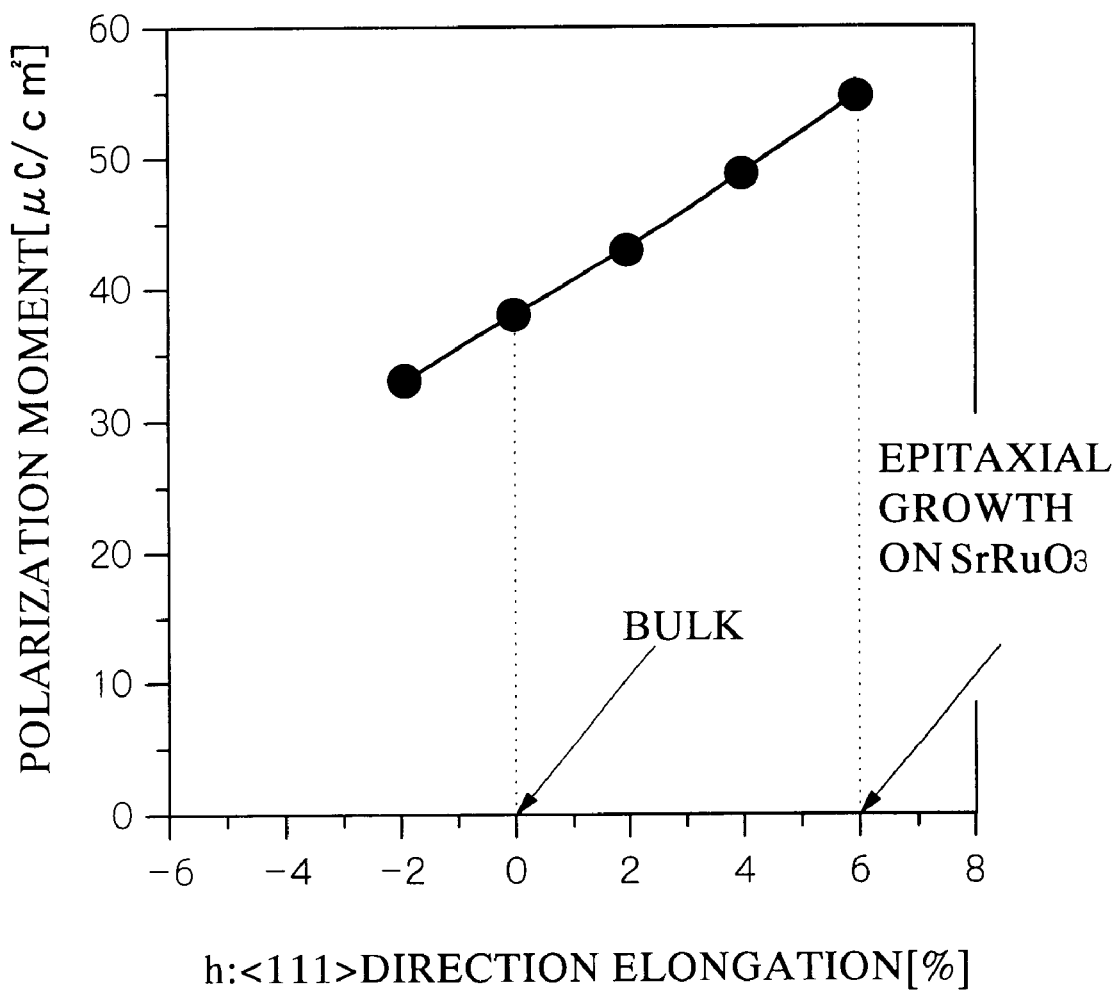
FIG. 3 is a diagram showing a relationship of the elongation amount h in the recording layer in a <111> direction in a pseudo-cubic system to the polarization moment in Example 3.

FIG. 3 shows a relationship of the amount h of elongation of the unit crystal lattice in a <111> direction in a pseudo-cubic system to the polarization moment obtained from the Berry phase. The origin of the horizontal axis corresponds to the crystal structure of a bulk material having a trigonal crystal structure. From FIG. 3, it can be seen that, as the value of h increases, the polarization moment increases. In particular, at the point corresponding to a 6% increase expected for the value of h for $BaTiO_3$ epitaxially grown on $SrRuO_3$, the polarization moment reaches a value of 55 $\mu C/cm^2$, which is 1.4 times the value of 35 $\mu C/cm^2$ for h=0 (corresponding to a bulk material). Therefore, it can be understood that it is possible to increase the polarization moment to almost 40% in highly strained epitaxially grown crystals.

FIG. 3 also shows that, when the amount h of elongation of the unit crystal lattice exceeds 2%, the polarization moment increases by about 5 $\mu C/cm^2$ compared with a bulk material. This result shows that, when h is increased more than 2%, it is possible in practice to increase the polarization moment substantially.

EXAMPLE 4

FIG. 4 shows a lateral cross sectional view of a ferroelectric memory element of this Example 4. An Si substrate plate 11 was cut so as to expose the (001) surface which was thermally oxidized to form an $SiO_2$ film 12. An electrode layer 13 was formed by laminating a Pt layer on the $SiO_2$ film 12. An electrode layer 14 was formed by laminating $SrRuO_3$ on the electrode layer 13. A recording layer 15 was formed by laminating $BaTiO_3$ on the electrode layer 14. An electrode layer 16 was formed by laminating $SrRuO_3$ on the recording layer 15. The film thicknesses of the electrode layer 13, electrode layer 14, recording layer 15, and electrode layer 16 were 200 nm, 100 nm, 20 nm and 200 nm, respectively. The electrode layer 13 comprising Pt was prepared by sputtering. The electrode layer 14, recording layer 15 and electrode layer 16 were prepared by means of laser ablation. A film forming operation was carried out for the electrode layer 13 under the conditions of room temperature and argon gas at 400 mPa (3 mTorr). Film forming operations for the electrode layer 14, recording layer 15 and electrode layer 16 were carried out in all cases under the conditions of the substrate temperature at 700° C. and an oxygen partial pressure at 400 mPa (3 mTorr). Both $SrRuO_3$ and $BaTiO_3$ exhibited a perovskite-type oxide structure.

According to X-ray diffraction results, Pt in the electrode layer 13 was oriented in a <111> direction in a face-centered-cubic structure. It is considered that the electrode layer 13 comprising Pt has oriented itself naturally. The lattice constant of the face-centered-cubic structure was 391 pm. $BaTiO_3$ in the recording layer 15 had a trigonal crystal structure and was oriented in a <111> direction in a pseudo-cubic system. The unit cell was elongated in a <111> direction in a pseudo-cubic system by about 5% compared with a trigonal crystal structure of the base state of a bulk material (the most stable structure at cryogenic temperatures). For interest, the unit cell constant "a" of a trigonal crystal structure of a bulk crystal of $BaTiO_3$ in the base state is 400 pm and the angle a is 89 degrees and 51 minutes. Also, the crystal structures of $SrRuO_3$ in the electrode layers 14 and 16 were oriented in a <111> direction in a pseudo-cubic system. Here, the lattice constants in the pseudo-cubic system were 391 pm in all cases. These results suggest that the electrode layer 14, recording layer 15 and electrode layer 16 developed their crystal structures in line with the lattice constant of Pt in the electrode layer 13 which served as the base structure.

Electron microscope examination indicated that the electrode layer 13 consisted of polycrystals of Pt. For this reason, the electrode layer 14, recording layer 15 and electrode layer 16 which were laminated on top of the electrode layer 13 also comprise polycrystals. However, it was indicated from the results of X-ray diffraction that, within each crystal of the polycrystals, the lattice constant of Pt determined the lattice constant of the structure of the layers formed above. In this context, it can be said that the electrode layer 14, recording layer 15 and electrode layer 16 in this example have been grown epitaxially on the electrode layer 13.

The polarization moment of the memory element thus obtained was 48 $\mu C/cm^2$. The Curie temperature was over 300° C. These values are more than satisfactory as the characteristics of a ferroelectric memory element.

Furthermore, no structural phase transition occurred within the temperature range of use (for example, −10 to 100° C.).

In this Example 4, same effects are obtained when the $SiO_2$ amorphous film 12 is replaced with an equivalent insulation film, for example, SiOF. Also, in this Example 4, the thickness of each film may be varied within a range that does not negate the effects of the invention.

In this Example 4, the electrode layers 14 and 16 are not limited to $SrRuO_3$. For example, as will be described in Example 5, it may be replaced with another oxide, as long as it has a perovskite-type structure and is electrically conductive. In general, the lattice constants of perovskite-type oxides are in a range of 390 to 400 pm in a pseudo-cubic system and are close to 391 pm which is the lattice constant of face-centered-cubic Pt. Therefore, it is thought that the (111) planes of a perovskite-type structure in a pseudo-cubic system are compatible for growth on the (111) planes of Pt which has a face-centered-cubic structure. Therefore, Pt oriented in the <111> direction is very advantageous in forming $SrRuO_3$ having a pseudo-cubic system oriented in the <111> direction. Further, $BaTiO_3$ having a trigonal crystal structure and oriented in a <111> direction in a pseudo-cubic system is easily grown on top of $SrRuO_3$ oriented in the <111> direction in a pseudo-cubic system. With respect to the polarization moment, it is greater for trigonal $BaTiO_3$ (48 $\mu C/cm^2$ in this example) oriented in the <111> direction in a pseudo-cubic system compared with the value for tetragonal $BaTiO_3$ (29 $\mu C/cm^2$ in bulk material) oriented in a <001> direction in a pseudo-cubic system. Therefore, the structure in the present invention is very effective in realizing a high polarization moment.

In Example 4, the electrode layer 13 is not limited to Pt. A material is acceptable if it has a face-centered-cubic structure and has a lattice constant, in the <111> orientation, close to that of a perovskite-type structure material used in the electrode layer 14. Therefore, the same effects are obtained if Pt is alloyed with another element such as Ir that has an atomic radius close to that of Pt.

Comparative Example 1

Figure 5:
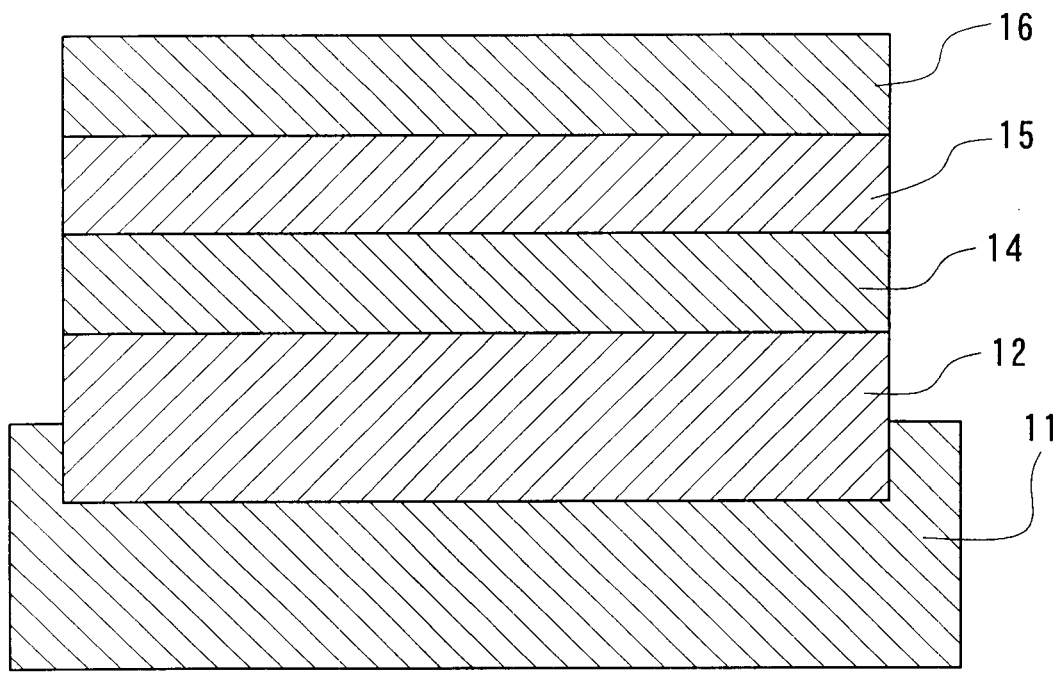
FIG. 5 is a lateral cross sectional view of a ferroelectric memory element in Comparative Example 1.

FIG. 5 shows a lateral cross sectional view of a ferroelectric memory element in Comparative Example 1. An Si substrate plate 11 was cut so as to expose the (001) surface which was thermally oxidized to form an $SiO_2$ film 12. An electrode layer 14 was formed by laminating $SrRuO_3$ on the electrode layer 12. A recording layer 15 was formed by epitaxially growing $BaTiO_3$ on the electrode layer 14. An electrode layer 16 was formed by further laminating $SrRuO_3$ on the recording layer 15. The film thicknesses of the electrode layer 14, recording layer 15 and electrode layer 16 were 100 nm, 20 nm and 200 nm, respectively. The electrode layer 14, recording layer 15 and electrode layer 16 were prepared by means of laser ablation. Film forming operations for the electrode layer 14, recording layer 15 and electrode layer 16 were carried out in all cases under the conditions of the substrate temperature at 700° C. and an oxygen partial pressure at 400 mPa (3 mTorr).

According to X-ray diffraction results, the electrode layer 14, recording layer 15 and electrode layer 16 were all randomly oriented. BaTiO$_3$ in the recording layer exhibited a tetragonal crystal symmetry.

The polarization moment of the memory element thus obtained was 13 $\mu$C/cm$^2$, and the Curie temperature was 120° C. These values are not desirable characteristics for a ferroelectric memory element. Particularly, the low Curie temperature would present a problem in its use.

EXAMPLE 5

FIG. 4 shows a lateral cross sectional view of a ferroelectric memory element in Example 5. An Si substrate plate 11 was cut so as to expose the (001) surface which was thermally oxidized to form an SiO$_2$ film 12. An electrode layer 13 was formed by laminating a Pt layer on the SiO$_2$ film 12. An electrode layer 14 was formed by laminating SrTiO$_3$, made electrically conductive by doping with Nb, on the electrode layer 13. Nb was added at a level of 1 a/o. Next, a recording layer 15 was formed by laminating BaTiO$_3$ on the electrode layer 14. Further, an electrode layer 16 was formed by laminating SrTiO$_3$, made electrically conductive by doping with Nb, on the recording layer 15. The film thicknesses of the electrode layer 13, electrode layer 14, recording layer 15 and electrode layer 16 were 200 nm, 100 nm, 20 nm and 200 nm, respectively. The electrode layer 13 comprising Pt was prepared by sputtering. The electrode layer 14, recording layer 15 and electrode layer 16 were prepared by means of laser ablation. A film forming operation was carried out for the electrode layer 13 under the conditions of room temperature and argon gas at 400 mPa (3 mTorr). Film forming operations for the electrode layer 14, recording layer 15 and electrode layer 16 were carried out in all cases under the conditions of the substrate temperature at 700° C. and an oxygen partial pressure at 400 mPa (3 mTorr).

According to X-ray diffraction results, Pt in the electrode layer 13 was oriented in the <111> direction in a face-centered-cubic structure. It is considered that the electrode layer 13 comprising Pt has oriented itself naturally on the SiO$_2$ layer 12. The lattice constant of the face-centered-cubic structure was 391 pm. BaTiO$_3$ having a trigonal crystal structure in the recording layer 15 was oriented in the <111> direction in a pseudo-cubic system. The unit cell was elongated in a <111> direction in a pseudo-cubic system by about 5% compared with a trigonal crystal structure of the base state of a bulk material (the most stable structure at cryogenic temperatures). The crystal structure of SrTiO$_3$ doped with Nb in the electrode layers 14 and 16 was oriented in the <111> direction in a pseudo-cubic system. The lattice constants of the pseudo-cubic structures in all cases were 391 pm.

The polarization moment thus obtained was 50 $\mu$C/cm$^2$. The Curie temperature was higher than 300° C.

In this Example 5, the same effects are obtained when the SiO$_2$ amorphous film 12 is replaced with an equivalent insulation film, for example, SiOF. Also, in this Example 5, the thickness of each film may be varied within a range that does not negate the effects of the invention.

In this Example 5, the electrode layers 14, 15 exhibit similar effects when any SrTiO$_3$ made electrically conductive by doping is used. It is preferable that the dopant be Nb or La added in a range of 0.1 to 5.0 a/o. SrTiO$_3$ serving as the base material exhibits a cubic crystal structure and has a lattice constant of 391 pm, and BaTiO$_3$ in the recording layer 13 formed thereon receives substantially the same degree of lattice strain (elongation) in a range of 5 to 6% as when the electrode layer 12 comprised SrRuO$_3$.

EXAMPLE 6

FIG. 6 shows a lateral cross sectional view of a ferroelectric memory element in Example 6. An Si substrate plate 21 was cut so as to expose the (001) surface which was thermally oxidized to form an SiO$_2$ film 22. An electrode layer 23 was formed by laminating an Ir layer on the SiO$_2$ film 22. An electrode layer 24 was formed by laminating a Pt layer on the electrode layer 23. An electrode layer 25 was formed by laminating SrRuO$_3$ on the electrode layer 24. A recording layer 26 was formed by laminating BaTiO$_3$ on the electrode layer 25. Further, an electrode layer 27 was formed by laminating SrRuO$_3$ on the recording layer 26. The film thicknesses of the electrode layers 23, electrode layer 24, electrode layer 25, recording layer 26 and electrode layer 27 were 100 nm, 200 nm, 100 nm, 20 nm and 200 nm, respectively. The electrode layer 23 comprising Ir and the electrode layer 24 comprising Pt were prepared by sputtering. The electrode layer 25, recording layer 26 and electrode layer 27 were prepared by means of laser ablation. Film forming operations were carried out for the electrode layers 23, 24 under the conditions of room temperature and argon gas at 400 mPa (3 mTorr). Film forming operations for the electrode layer 25, recording layer 26 and electrode layer 27 were carried out in all cases under the conditions of the substrate temperature at 700° C. and an oxygen partial pressure at 400 mPa (3 mTorr). Both SrRuO$_3$ and BaTiO$_3$ exhibited a perovskite-type oxide structure.

According to X-ray diffraction results, Pt in the electrode layer 24 was oriented in the <111> direction in a face-centered-cubic structure. It is considered that the electrode layer 24 comprising Pt has oriented itself naturally on the electrode layer 23 comprising Ir. The lattice constant of Pt in the face-centered-cubic structure was 391 pm. BaTiO$_3$ having a trigonal crystal structure in the recording layer 26 was oriented in the <111> direction in a pseudo-cubic system. The unit cell was elongated in a <111> direction in a pseudo-cubic system by about 5% compared with a trigonal crystal structure of the base state of a bulk material (the most stable structure). For interest, the lattice constant "a" of a bulk crystal of BaTiO$_3$ in the stable state of a trigonal crystal structure is 400 pm and the angle a is 89 degrees and 51 minutes. The crystal structures of SrRuO$_3$ in the electrode layers 25 and 27 were oriented in the <111> direction in a pseudo-cubic system. The lattice constants of the pseudo-cubic structures in all cases were 391 pm. These results suggest that the electrode layer 25, recording layer 26 and electrode layer 27 developed their crystal structures in line with the lattice constant of Pt in the electrode layer 24 which served as the base structure.

Electron microscope examination indicated that the electrode layer 24 consisted of polycrystals of Pt. For this reason, the electrode layer 25, recording layer 26 and electrode layer 27 which were laminated on top of the electrode layer 24 also comprised polycrystals. However, it was indicated from the results of X-ray diffraction that, within each crystal of the polycrystals, the lattice constant of Pt determined the lattice constant of the structure of the layers formed above. In this context, it can be said that the electrode layer 25, recording layer 26 and electrode layer 27 in this example have been grown epitaxially on the electrode layer 24.

The polarization moment of the memory element thus obtained was 48 $\mu$C/cm$^2$. The Curie temperature was not lower than 300° C. These values are more than satisfactory as the characteristics of a ferroelectric memory element.

The polarization moment did not degrade even after repeated cycles of 10$^{12}$ reproductions. It is thought that this was due to a suppressing effect on diffusion of oxygen by the electrode layer 23 comprising Ir.

Furthermore, no structural phase transition occurred within the temperature range of use (for example, −10 to 100° C.).

In this example, the same effects are obtained when Ir in the electrode layer 23 is replaced with an oxide such as IrO$_2$. Oxides of Ir are suitable not only as a blocking layer for oxygen diffusion but also as an electrode material because of their electrical conductivity. Also, the same effects are obtained even if oxides such as IrO$_2$ are formed at the interface between the electrode layer 23 and SiO$_2$ film 22 or the electrode layer 24. The same effects are also obtained if an intermediate layer, comprised by oxides such as IrO$_2$, is formed within the electrode layer 23.

The same effects are obtained when the SiO$_2$ amorphous film 22 is replaced with an equivalent insulation film, for example, SiOF. Also, in this example, the thickness of each film may be varied within a range that does not negate the effects of the invention.

In this example, a technique of protecting the recording layer 26 from a reducing atmosphere for the recording layer 26 prevalent in a series of semiconductor processes by further laminating Ir or an Ir oxide on top of the electrode layer 27 is an effective means for maintaining the properties of the recording layer 26.

In general, the lattice constants of perovskite-type oxides are in a range of 390 to 410 pm in a pseudo-cubic system and are close to 391 pm, which is the lattice constant of face-centered-cubic Pt. Therefore, it is thought that the (111) planes of a perovskite-type structure of a pseudo-cubic system are compatible for growing on the (111) planes of Pt which has a face-centered-cubic structure. Therefore, Pt oriented in a <111> direction is very advantageous in forming SrRuO$_3$ oriented in a <111> direction in a pseudo-cubic system. Further, trigonal BaTiO$_3$ oriented in a <111> direction in a pseudo-cubic system is easily grown on top of SrRuO$_3$ oriented in the <111> direction in a pseudo-cubic system. With respect to the polarization moment, the value for trigonal BaTiO$_3$ (48 $\mu$C/cm$^2$ in this example) oriented in the <111> direction in a pseudo-cubic system is greater than the value for BaTiO$_3$ (29 $\mu$C/cm$^2$ in bulk material) oriented in the <111> direction in a pseudo-cubic system. Therefore, the structure in the present invention is very effective in realizing a high polarization moment.

In this example, the electrode layers 25 and 27 are not limited to SrRuO$_3$. The same effects are obtained by using a perovskite-type oxide such as SrTiO$_3$ doped with Nb, for example, which is electrically conductive. SrTiO$_3$ having a suitable dopant exhibits electrical conductivity. As the dopants to be added to SrTiO$_3$, it is preferable to use Nb or La in a range of 0.1 to 5.0 a/o. The base material comprises SrTiO$_3$ which has a cubic symmetry and a lattice constant of 391 pm, and the recording layer 23 comprising BaTiO$_3$ laminated on such a base material receives about the same degree of lattice distortion (elongation), at a level of 6 to 7%, as the distortion generated as when the electrode layer 23 comprises SrRuO$_3$.

The ferroelectric memory element in Example 4 is manufactured by following the same procedure as that used in Example 6, except that Example 4 did not involve the Ir layer 23. The ferroelectric memory element obtained in Example 4 exhibited a 50% drop in the polarization moment when it was subjected to a repeatability test of 10$^{12}$ cycles.

The entire disclosures of Japanese Patent Application Nos. 2001-081352 filed Mar. 21, 2001; 2001-081353 filed Mar. 21, 2001; 2001-081354 filed Mar. 21, 2001; and 2002-073091 filed Mar. 15, 2002 are incorporated by reference.

What is claimed is:

1. A ferroelectric memory element having a recording layer comprising BaTiO$_3$ having a trigonal crystal structure oriented in a <111> direction in a pseudo-cubic system and a polarization moment in the <111> direction in a pseudo-cubic system is used for reading recorded signals.

2. A ferroelectric memory element according to claim 1, wherein a thickness of the recording layer is not more than 50 nm.

3. A ferroelectric memory element according to claim 1, wherein a unit cell of BaTiO$_3$ crystal structure is elongated in a <111> direction in a pseudo-cubic system, compared with a unit cell of a trigonal crystal structure of a bulk material of BaTiO$_3$ in a most stable state.

4. A ferroelectric memory element according to claim 3, wherein a thickness of the recording layer is not more than 50 nm.

5. A ferroelectric memory element according to claim 3, wherein a degree of elongation is not less than 2%.

6. An electronic apparatus provided with a ferroelectric memory element according to claim 1.

7. A ferroelectric memory element comprising:
   a first electrode layer;
   a recording layer formed on top of the first electrode layer by laminating BaTiO$_3$ having a trigonal crystal structure in such a way as to be oriented in a <111> direction in a pseudo-cubic system and to elongate a unit cell of the trigonal crystal structure in the <111> direction in a pseudo-cubic system to a level of not less than 2% compared with a unit cell of trigonal bulk material of BaTiO$_3$ in a most stable state; and
   a second electrode layer laminated on the recording layer, wherein a polarization moment in the <111> direction in a pseudo-cubic system of the recording layer is used for reading recorded signals.

8. A ferroelectric memory element according to claim 7, wherein a thickness of the recording layer is not more than 50 nm.

9. A ferroelectric memory element according to claim 7, wherein the first electrode layer and the second electrode layer comprise SrRuO$_3$.

10. A ferroelectric memory element according to claim 7, wherein the first electrode layer and the second electrode layer comprise SrTiO$_3$ converted to an electrically conductive form.

11. An electronic apparatus provided with a ferroelectric memory element according to claim 7.

12. A ferroelectric memory element comprising:
   a first electrode layer formed of a metallic material having a cubic crystal structure and oriented in a <111> direction;
   a second electrode layer, having a perovskite-type crystal structure and formed on the first electrode layer so as to be oriented in a <111> direction in a pseudo-cubic system;
   a recording layer formed of BaTiO$_3$ having a trigonal crystal structure laminated on top of the second electrode layer so as to be oriented in a <111> direction in a pseudo-cubic system; and a third electrode layer laminated on top of the recording layer wherein a polarization moment generated in the <111> direction in a pseudo-cubic system in the recording layer is used for reading recorded signals.

13. A ferroelectric memory element according to claim 12, wherein the first electrode layer comprises Pt having a face-centered-cubic structure.

14. A ferroelectric memory element according to claim 12, wherein the first electrode layer comprises Pt and the second electrode layer comprises $SrRuO_3$.

15. A ferroelectric memory element according to claim 12, wherein the first electrode layer comprises Pt and the second electrode layer comprises $SrTiO_3$ converted to an electrically conductive form.

16. A ferroelectric memory element according to claim 12, wherein the first electrode layer is laminated on top of an amorphous oxide layer.

17. A ferroelectric memory element according to claim 12, wherein a unit cell of $BaTiO_3$ crystal structure is elongated in a <111> direction in a pseudo-cubic system, compared with a unit cell of a trigonal crystal structure of a bulk material of $BaTiO_3$ in a most stable state.

18. A ferroelectric memory element according to claim 17, wherein the first electrode layer comprises Pt in a face-centered-cubic structure.

19. A ferroelectric memory element according to claim 17, wherein the first electrode layer comprises Pt and the second electrode layer comprises $SrRuO_3$.

20. A ferroelectric memory element according to claim 17, wherein the first electrode layer comprises Pt and the second electrode layer comprises $SrTiO_3$ converted to an electrically conductive form.

21. A ferroelectric memory element according to claim 17, wherein the first electrode layer is laminated on top of an amorphous oxide layer.

22. An electronic apparatus provided with a ferroelectric memory element according to claim 12.

23. A ferroelectric memory element comprising:

a first electrode layer formed of one of Ir and an Ir oxide;

a second electrode layer formed of Pt having a face-centered cubic structure and formed on the first electrode layer so as to be oriented in a <111> direction in a pseudo-cubic system;

a third electrode layer, having a perovskite-type crystal structure and formed on the second electrode layer so as to be oriented in a <111> direction in a pseudo-cubic system;

a recording layer, formed of $BaTiO_3$ having a trigonal crystal structure and formed on top of the third electrode layer so as to be oriented in a <111> direction in a pseudo-cubic system; and a fourth electrode layer, having the perovskite-type crystal structure and laminated on top of the recording layer so as to be oriented in a <111> direction in a pseudo-cubic system;

wherein a unit cell of a crystal structure of $BaTiO_3$ in the recording layer is elongated in the <111> direction in a pseudo-cubic system compared with a unit cell of a bulk material of $BaTiO_3$ in a trigonal crystal structure which represents the most stable state, and a polarization moment generated in the <111> direction in a pseudo-cubic system in the recording layer is used for reading recorded signals.

24. A ferroelectric memory element according to claim 23, wherein the third electrode layer comprises $SrRuO_3$.

25. A ferroelectric memory element according to claim 23, wherein the third electrode layer comprises $SrTiO_3$ converted to an electrically conductive form.

26. A ferroelectric memory element according to claim 23, wherein the first electrode layer is laminated on top of an amorphous oxide layer.

27. A ferroelectric memory element according to claim 23, wherein the fourth electrode layer is overlaid with a fifth electrode layer formed of one of Ir and an Ir oxide.

28. An electronic apparatus provided with a ferroelectric memory element according to claim 23.

* * * * *

UNITED STATES PATENT AND TRADEMARK OFFICE
CERTIFICATE OF CORRECTION

PATENT NO.     : 6,510,074 B2
DATED          : January 21, 2003
INVENTOR(S)    : Miyazawa et al.

It is certified that error appears in the above-identified patent and that said Letters Patent is hereby corrected as shown below:

<u>Title page,</u>
Item [75], Inventors', residences should be -- H. Miyazawa, Toyoshina, JP;
T. Higuchi, Matsumoto, JP; and S. Iwashita, Nirasaki, JP. --
Item [56], References Cited, please add:
-- FOREIGN PATENT DOCUMENTS,
JP 11-087634 03/30/1999

OTHER DOCUMENTS,
Yanase, et al, "Thickness Dependence of Ferroelectricity in Heteropitaxial BaTi03
Thin Film Capacitors", Jpn. J.Appl. Phys., Vol. 38 (1999), pp. 5305-5308. --

<u>Column 4,</u>
Line 9, please delete "the".

<u>Column 6,</u>
Line 48, please delete "Example" and replace it with -- Examples --.

<u>Column 8,</u>
Line 44, please delete "500 mn" and replace it with -- 500 nm --.

Signed and Sealed this

Thirtieth Day of September, 2003

JAMES E. ROGAN
*Director of the United States Patent and Trademark Office*